US006680627B2

United States Patent
Hughes

(12) United States Patent
(10) Patent No.: US 6,680,627 B2
(45) Date of Patent: Jan. 20, 2004

(54) BALANCED TRANSCONDUCTOR AND ELECTRONIC DEVICE

(75) Inventor: John B. Hughes, Hove (GB)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/253,259

(22) Filed: Sep. 24, 2002

(65) Prior Publication Data
US 2003/0080786 A1 May 1, 2003

(30) Foreign Application Priority Data
Oct. 27, 2001 (GB) .............................................. 0125827

(51) Int. Cl.$^7$ .............................................. H03D 11/00
(52) U.S. Cl. ........................ 327/103; 327/403; 330/258
(58) Field of Search ........................ 327/103, 108–112, 327/309, 310, 403, 404; 330/258

(56) References Cited

U.S. PATENT DOCUMENTS 5,568,561 A * 10/1996 Whitlock .................... 381/120
5,856,757 A * 1/1999 Eschauzier ................... 327/553
5,939,904 A * 8/1999 Fetterman et al. ............. 327/67
5,955,922 A * 9/1999 Nicollini et al. ............. 330/258
6,191,655 B1 * 2/2001 Moughabghab ............. 330/277

FOREIGN PATENT DOCUMENTS

EP           0384710 A1    8/1990

OTHER PUBLICATIONS

"Linear CMOS transconductance element for VHF filters", B. Nauta and E. Seevinck, Electronics Letters, 30$^{th}$ Mar. 1989, vol. 25, No. 7.

* cited by examiner

Primary Examiner—Kenneth B. Wells
(74) Attorney, Agent, or Firm—Aaron Waxler

(57) ABSTRACT

A balanced transconductor having a pair of voltage inputs and a pair of current outputs comprises a pair of single-ended transconductors, one in each signal path and a cancellation network. The cancellation network cancels at the inputs to the single-ended transconductors a common mode voltage appearing at the voltage inputs so that no common mode output current results. The cancellation network may comprise four half-size single-ended transconductors drawing half the supply current of full-size single-ended transconductors.

4 Claims, 9 Drawing Sheets

BALANCED TRANSCONDUCTOR AND ELECTRONIC DEVICE

The present invention relates to a balanced transconductor suitable for use in active electronic filters and an electronic device comprising a balanced transconductor.

In the field of wireless communications, a preferred radio receiver architecture for achieving a high sensitivity fully integrated wireless transceiver is the low-IF (intermediate frequency) polyphase receiver architecture. One of the keys to the success of this polyphase architecture is the ability to integrate the channel filter. In order to increase the level of circuit integration and to reduce power consumption, it is desirable to implement wireless transceivers in mixed analogue and digital integrated circuits (ICs) and to implement such mixed signal ICs in a low voltage digital CMOS process.

One component which can be used to implement an integrated channel filter is the transconductor. Transconductors are important components for many types of electronic circuit. They form the basis of the transconductor-capacitor (Gm-C) class of active filters, and with extra switches they create switched-current memories for sampled-data filters. Ideally, they linearly convert an input voltage into an output current with both input and output ports presenting infinite impedance.

Therefore, it is desirable to devise transconductor circuits that have a high performance and can be implemented in a low voltage digital CMOS process.

A single-ended transconductor cell illustrated in FIGS. 1 (circuit schematic) and 2 (block schematic) employs a PMOS/NMOS transistor pair. If the PMOS and NMOS transistors are dimensioned to have equal transconductances $g_m$, the overall transconductance of this single-ended cell is $-G=-2.g_m$. Further, if they have equal threshold voltages, and using a pair of voltage supply rails $V_{ss}$ and $V_{dda}$, for simplicity assuming $V_{ss}=0$, and biasing the input voltage at the mid-rail voltage, $V_{dda}/2$, equal drain currents J are produced in both the PMOS and NMOS transistors and the output current $i_{out}$ is zero. When the input voltage changes by $v_{in}$, the drain currents of both transistors are unbalanced and a linearly related current, $i_{out}=-G.v_{in}$, flows at the output. The transconductor is very efficient because it operates in class AB and clipping does not occur until the output current $i_{out}$ reaches 4.J.

A balanced transconductor, which converts a balanced input voltage into a balanced output current, is illustrated in FIGS. 3 (circuit schematic) and 4 (block schematic). It comprises two of the single-ended transconductor cells of FIGS. 1 and 2, one converting the positive signal voltage and the other converting the negative signal voltage, and it achieves a differential transconductance $G_d=G/2$. In active filters, inversion of signals is frequently required and can be achieved by simply crossing over signal pairs. Unfortunately, if this simple balanced transconductor is used in feedback networks such as those occurring in active filters the circuits become unstable. Use with feedback networks is illustrated in FIG. 5, and equivalently in FIG. 6 in which a negative feedback loop comprising inverting and non-inverting single-ended transconductors (FIG. 5) is implemented with all inverting single-ended transconductors with wired cross-overs creating the extra inversion (FIG. 6). In this configuration the four inverting single-ended transconductors form a positive feedback loop and in practice the circuit behaves like a digital latch with the inputs and outputs switching to one or other of the supply rails.

The problems of instability can be resolved by using a common-mode feedback network having four additional single-ended transconductors configured as described in "Linear CMOS transconductace element for VHF filters", B. Nauta and E. Seevinck, Electronics Letters, 30$^{th}$ March 1989, Vol. 25, No. 7, as shown in FIG. 7. Assuming that the PMOS and NMOS transistors have identical parameters, then the common-mode input voltage producing zero output current is $v_{in}^+=v_{in}^-=V_{dda}/2$. With a purely differential input signal voltage $v_{dm}$, i.e. $v_{in}^+=V_{dda}/2+v_{dm}/2$ and $v_{in}^-=V_{dda}/2-v_{vm}/2$, the common-mode feedback network produces currents which cancel and the network between the two inputs presents infinite impedance. With a purely common-mode input signal voltage $v_{cm}$, i.e. $v_{in}^+=v_{in}^-=V_{dda}/2+v_{cm}$, the common-mode feedback network produces currents which add and the network produces resistive loads at the outputs. The differential and common-mode equivalent block schematic diagrams are shown in FIGS. 8 and 9 respectively.

A feedback loop containing two of the balanced transconductors of FIG. 7 is stable because the common-mode voltage gain of each of the additional single-ended transconductors is 0.5 giving a loop gain of 0.25. However, loops containing both this and the simple balanced transconductor of FIG. 3 are unstable. Filters made exclusively from the balanced transconductor of FIG. 7 will consume three times the power of a filter (albeit unstable) made from the simple balanced transconductor of FIG. 3 and this is a heavy penalty. Furthermore, the balanced transconductor of FIG. 7 has a common-mode rejection of only 0.5 (6 dB).

An object if the present invention is to provide an improved balanced transconductor and electronic device comprising a balanced transconductor.

According to one aspect of the invention there is provided a balanced transconductor comprising a first signal path between a first input terminal and a first output terminal, a second signal path between a second input terminal and a second output terminal, the first signal path comprising a first single-ended transconductor means and the second signal path comprising a second single-ended transconductor means, and a cancellation network coupled to the first and second signal paths, wherein the cancellation network is configured to provide cancellation at input ports of the first and second single-ended transconductor means of a common-mode voltage applied to the first and second input terminals.

By providing cancellation of a common-mode voltage an improved common-mode rejection ratio is obtained, and improved stability is obtained in feedback loops made using either two of the balanced transconductors according to the invention or even from one such balanced transconductor and a pair of single-ended transconductors.

Preferably the cancellation network comprises half-size single-ended transconductor means which use half-width transistors and draw half the supply current of the first and second single-ended transconductor means, thereby contributing to a low power consumption. Alternatively, other size transistors may be used. Small transistors will draw small currents.

According to a second aspect of the invention there is provided an electronic device comprising a balanced transconductor in accordance with the first aspect of the invention.

The present invention will now be described, by way of example, with reference to the accompanying drawings, wherein.

Figure 1:
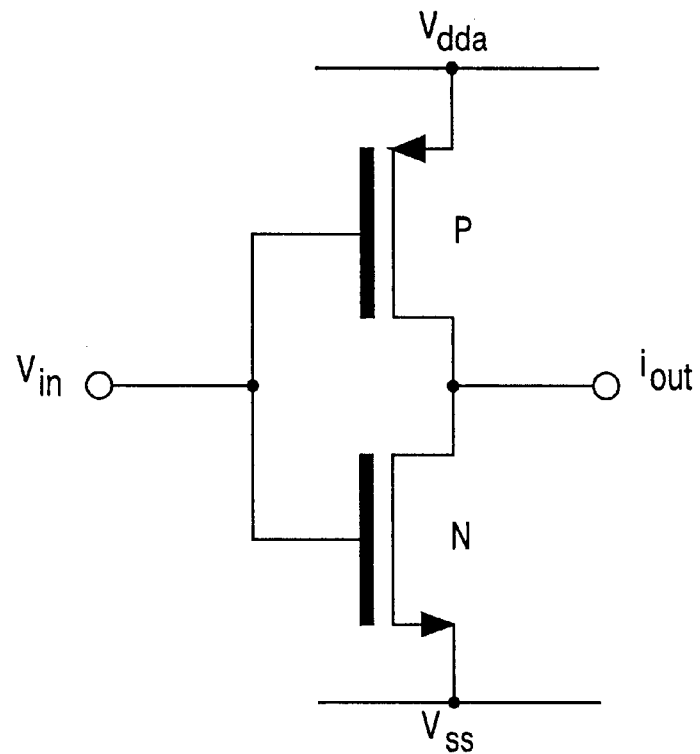
FIG. 1 is a circuit schematic diagram of a single-ended transconductor.
Figure 2:
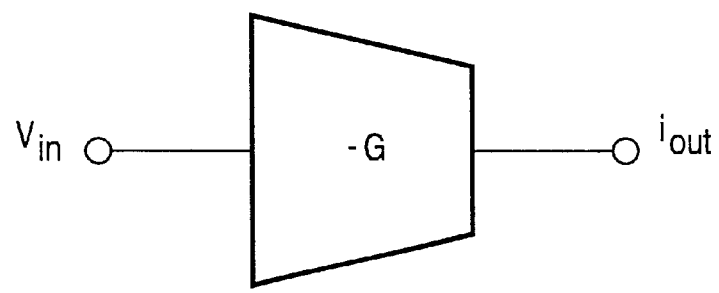
FIG. 2 is a block schematic diagram of a single-ended transconductor.
Figure 3:
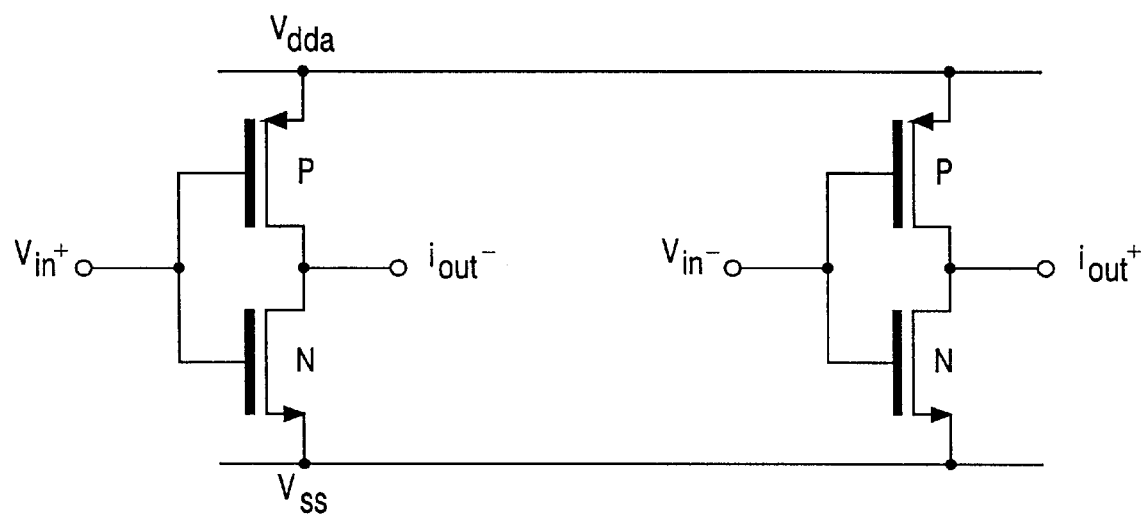
FIG. 3 is a circuit schematic diagram of a balanced transconductor.
Figure 4:
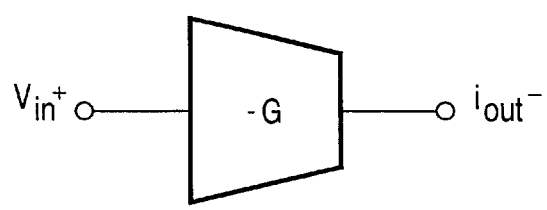
FIG. 4 is a block schematic diagram of a balanced transconductor.
Figure 4:
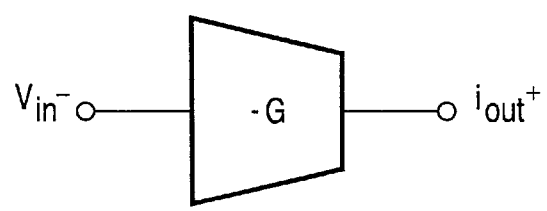
Figure 5:
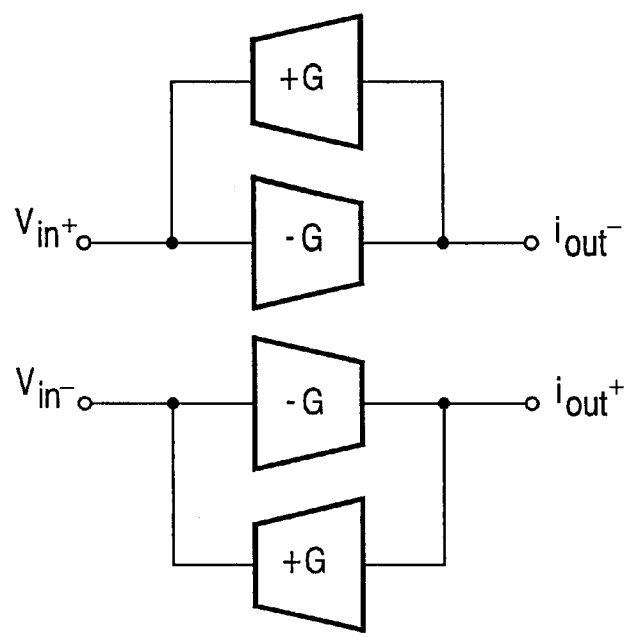
Figure 6:
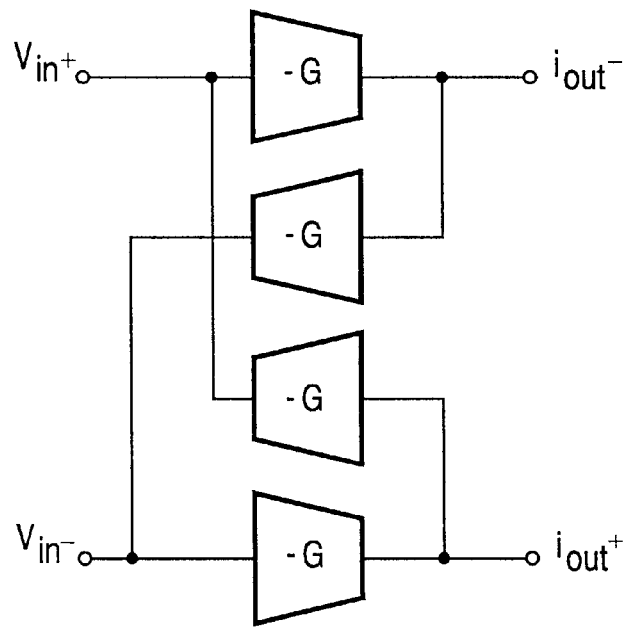
Figure 7:
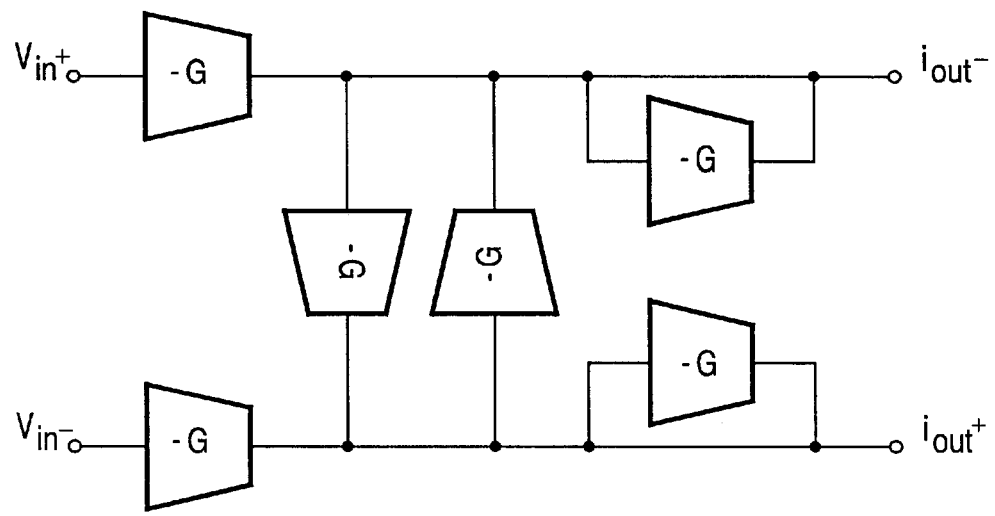
Figure 8:
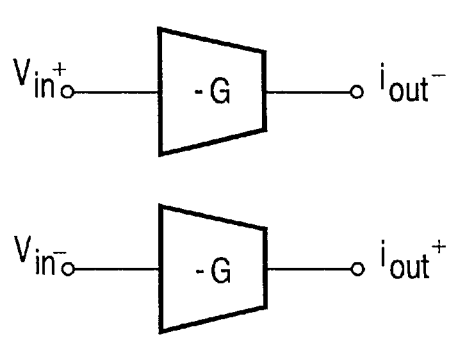
Figure 9:
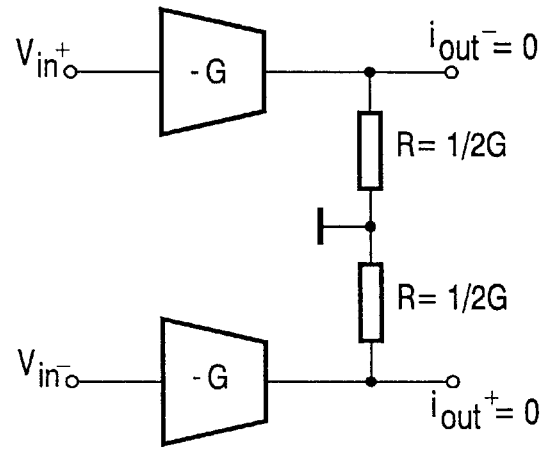
Figure 10:
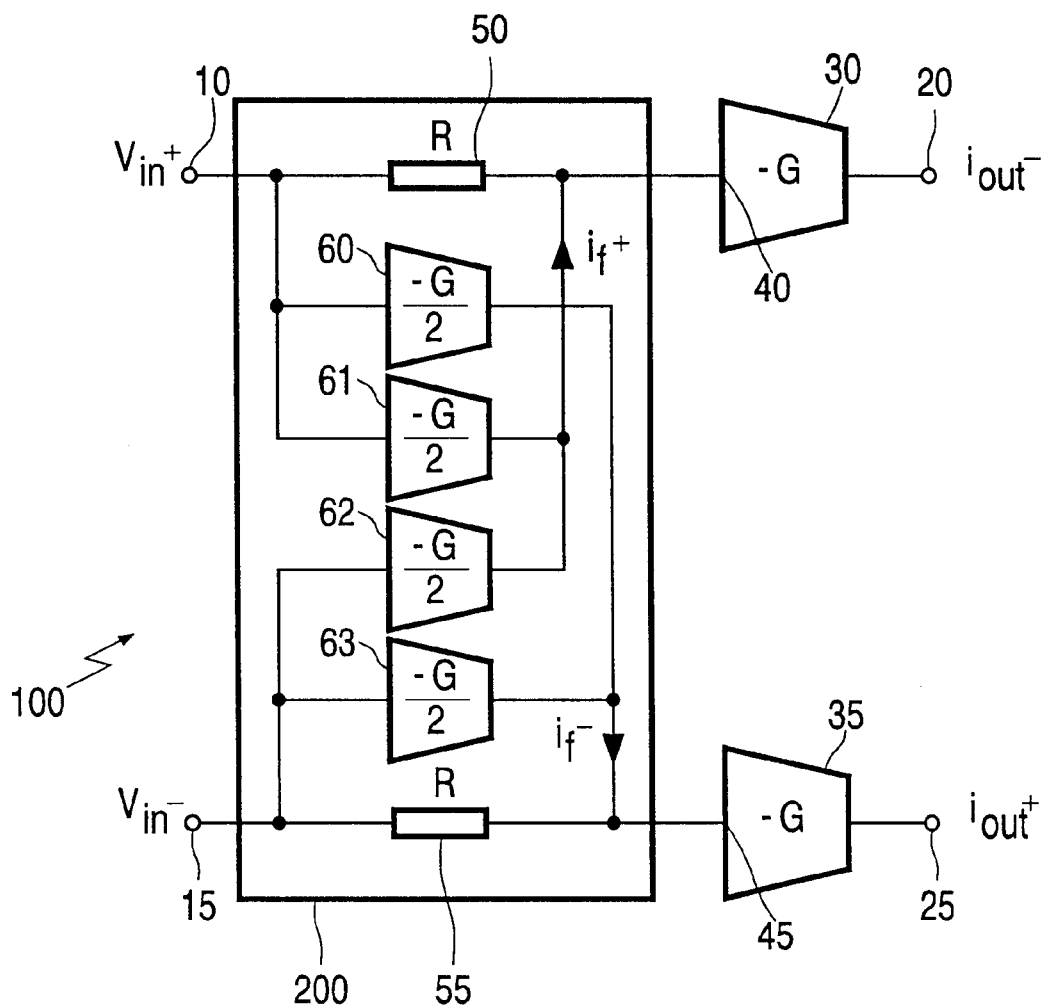
Figure 11:
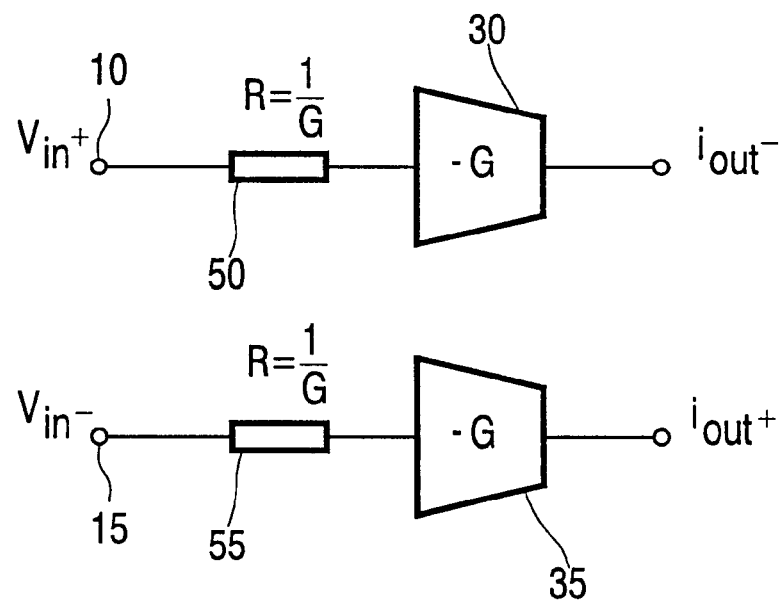
Figure 12:
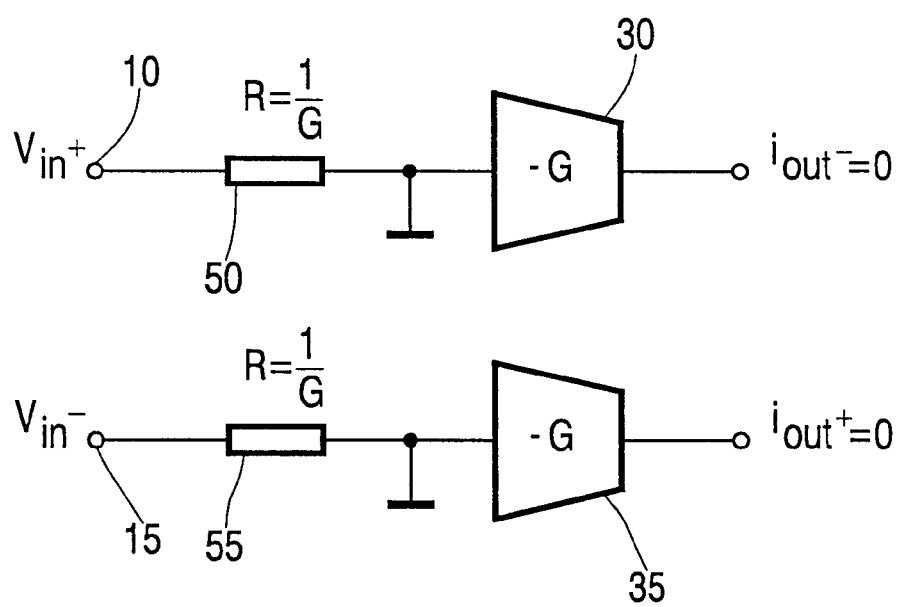
Figure 13:
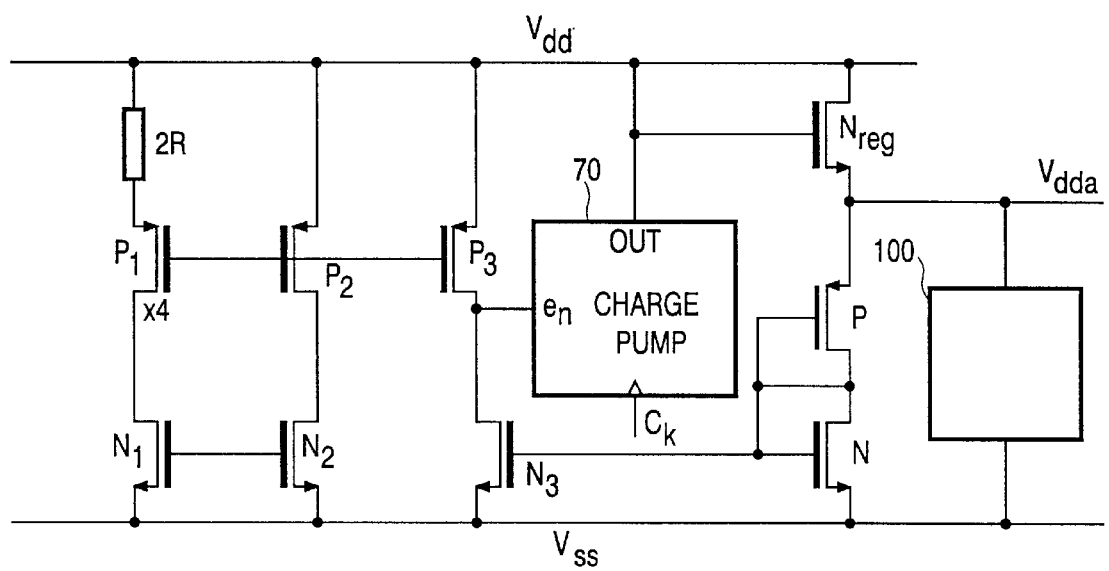
Figure 14:
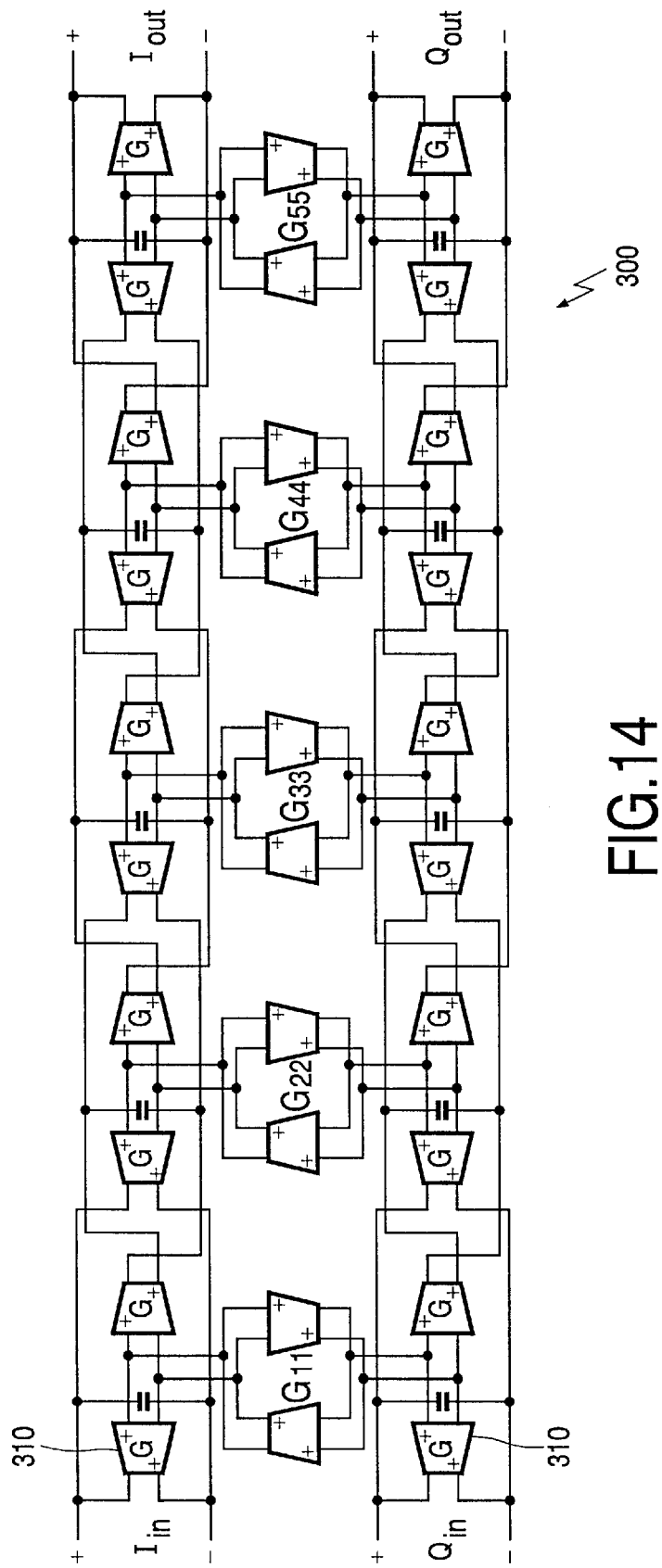
Figure 15:
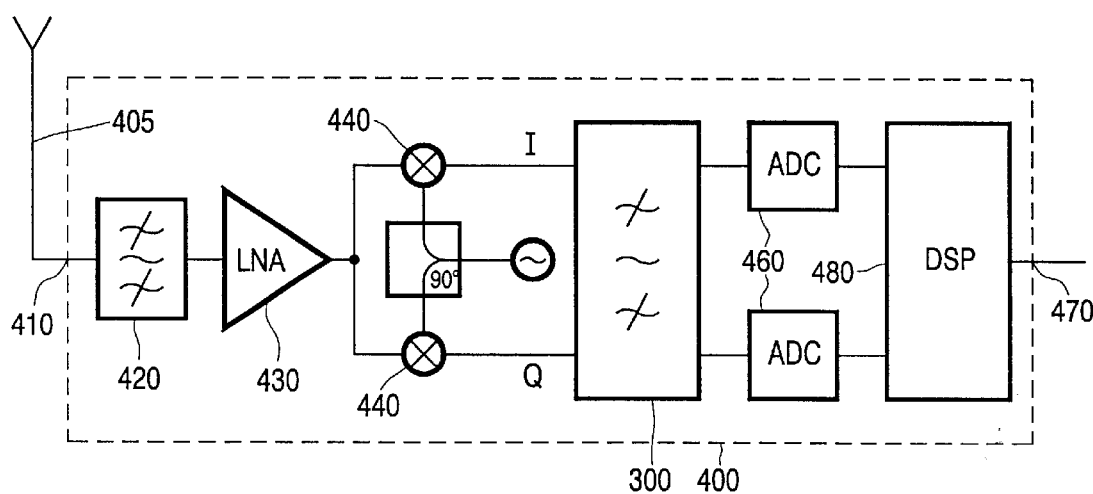

FIG. 5 is a block schematic diagram of a balanced transconductor having a common mode feedback network, FIG. 6 is an equivalent block schematic diagram of a balanced transconductor having a common mode feedback network and using inverting single-ended transconductors, FIG. 7 is a block schematic diagram of a balanced transconductor having a stabilisation common mode feedback network, FIG. 8 is a differential-mode equivalent block diagram of the balanced transconductor of FIG. 7, FIG. 9 is a common-mode equivalent block diagram of the balanced transconductor of FIG. 7, FIG. 10 is a block schematic diagram of a balanced transconductor in accordance with the invention, FIG. 11 is differential-mode equivalent block diagram of the balanced transconductor of FIG. 10, FIG. 12 is common-mode equivalent block diagram of the balanced transconductor of FIG. 10, FIG. 13 is a bias-control circuit, FIG. 14 is a block schematic diagram of an electronic filter comprising a balanced transconductor, and FIG. 15 is a block schematic diagram of a radio receiver.

Referring to FIG. 10 there is shown a balanced transconductor 100 having first and second inputs 10, 15, first and second outputs 20, 25, and first and second main single-ended transconductors 30, 35 each having transconductance −G and coupled to supply current to the first and second outputs 20, 25 respectively. There is a common-mode feedback cancellation network 200 coupled between the first and second inputs 10, 15 of the balanced transconductor 100 and inputs 40, 45 of the first and second main single-ended transconductors 30, 35.

The cancellation network 200 comprises a first resistor 50 of value R coupled between the first input 10 of the balanced transconductor 100 and the input 40 of the first main single-ended transconductor 40, and a second resistor 55 of value R coupled between the second input 15 of the balanced transconductor 100 and the input 45 of the second main single-ended transconductor 45. The cancellation network 200 further comprises four half-size single-ended transconductors 60, 61, 62, 63, each having transconductance −G/2. The half-size single-ended transconductors 60, 61, 62, 63 use half-width transistors and draw half the supply current of the main single-ended transconductors 30, 35.

The input of the first half-size transconductor 60 is coupled to the first input 10 of the balanced transconductor 100 and the output of the first half-size transconductor 60 is coupled to the input 45 of the second main single-ended transconductor 35. The input of the second half-size transconductor 61 is coupled to the first input 10 of the balanced transconductor 100 and the output of the second half-size transconductor 61 is coupled to the input 40 of the first main single-ended transconductor 30. The input of the third half-size transconductor 62 is coupled to the second input 15 of the balanced transconductor 100 and the output of the third half-size transconductor 62 is coupled to the input 40 of the first main single-ended transconductor 30. The input of the fourth half-size transconductor 63 is coupled to the second input 15 of the balanced transconductor 100 and the output of the fourth half-size transconductor 63 is coupled to the input 45 of the second main single-ended transconductor 35.

The value R of the first and second resistors 50, 55 and the transconductance −G are related by the expression R=1/G. In the general case, the transconductance values of the cancellation network 200 may be expressed as −G'/2, and the value of R given by R=1/G'.

Operation of the balanced transconductor 100 is as follows. First, consider the balanced transconductor 100 under quiescent conditions in which the input signal voltages are $v_{in}^{+}=v_{in}^{-}=V_{dda}/2$. The current in each of the common-mode feedback MOS transistors of the half-size transconductors 60, 61, 62, 63 is J/2 and the feedback currents are $i_f^{+}=i_f^{-}=0$. As no current flows in the first and second resistors 50, 55, the voltages applied to the inputs 40, 45 of the first and second main single-ended transconductors 30, 35 are also $V_{dda}/2$ and the currents at the outputs 20, 25 of the balanced transconductor 100 are zero.

Next, consider the balanced transconductor 100 with a purely differential input signal voltage $v_{dm}$ i.e. the input voltages are $v_{in}^{+}=V_{dda}/2+v_{dm}/2$ and $v_{in}^{-}=V_{dda}/2-v_{dm}/2$. The feedback currents are again $i_f^{+}=i_f^{-}=0$ because the half-size transconductors 60, 61 generate currents which are equal and opposite to the currents generated by the half-size transconductors 62, 63. The first and second resistors 50, 55 create no voltage drop, so the input voltages $v_{in}^{+}$ and $v_{in}^{-}$ are applied directly to the inputs 40, 45 respectively of the first and second main single-ended transconductors 30, 35 and a current of $v_{dm}.G/2$ flows at the balanced transconductor outputs 20, 25.

Now, consider the balanced transconductor 100 with a purely common-mode input signal voltage $v_{cm}$, i.e. the input voltages are $v_{in}^{+}=v_{in}^{-}=V_{dda}/2+v_{cm}$. The feedback currents are now $i_f^{+}=i_f^{-}=v_{cm}.G$ and they produce a voltage drop on the first and second resistors 50, 55 of $v_{cm}$ that subtracts from $v_{in}^{+}$ and $V_{in}^{-}$ so that the voltages at the inputs 40, 45 of the first and second main transconductors 30, 35 are Vdda/2 and the currents at the outputs 20, 25 of the balanced transconductor 100 are zero.

Differential-mode and common-mode equivalent circuits of the balanced transconductor 100 are shown in FIGS. 11 and 12 respectively. A common-mode input signal experiences a virtual short at the inputs 40, 45 of the main transconductors 30, 35 and this stablises feedback loops made from either two of the balanced transconductor 100 or even from the balanced transconductor 100 and a pair of single-ended transconductors.

A bias-control circuit for obtaining the required relationship R=1/G between the resistance R and the transconductance −G is illustrated in FIG. 13 in which the bias current supplied to the balanced transconductor 100 is controlled to force G=1/R. Referring to FIG. 13, the loop of transistors P1, P2, N1, N2 (P1 has 4 times the width of P2) sets the current in that loop such that the transconductance of P2 is ½R. This current is mirrored via P3 and summed with the current from N3 which is a mirror of the current in the diode-connected transconductor, P, N. If the current in $N_3$ is lower than that in $P_3$ then a charge pump 70, supplied with a clock $C_k$, is enabled at terminal $e_n$ and the gate of $N_{reg}$ is pumped high. This raises the voltage $V_{dda}$ supplying the balanced transconductor 100 until the currents in $N_3$ and $P_3$ become equal at which point the charge pump 70 is disabled and the loop stabilises.

An example of an electronic device comprising a balanced transconductor in accordance with the first aspect of the invention is shown in FIG. 14, which shows a block schematic diagram of an electronic filter 300 suitable for use as a channel filter in a low-IF radio receiver and arranged to filter in-phase (I) and quadrature phase (Q) signals. The electronic filter 300 comprises interconnected balanced transconductors and capacitors. In some applications it may not be necessary for every balanced transconductor in the electronic filter 300 to comprise the balanced transconductor in accordance with the first aspect of the invention. For example, sufficient common-mode cancellation may be obtained if only the input balanced transconductors 310 are in accordance with the first aspect of the invention.

Another example of an electronic device comprising the balanced transconductor in accordance with the first aspect of the invention is shown in FIG. 15, which shows a block schematic diagram of a radio receiver 400. The radio receiver 400 has an input 410 coupled to receive a signal from an antenna 420. The received signal is filtered by an antenna filter 420 and then amplified in a low noise amplifier (LNA) 430 before being downconverted in mixers 440 to produce in-phase and quadrature phase IF signals I and Q. The I and Q signals are filtered by the electronic filter 300 and then digitised in analogue-to-digital converters (ADCs) 460 before being demodulated in a digital signal processor (DSP) 480 which provides a demodulated signal on an output 470.

What is claimed is:

1. A balanced transconductor comprising a first signal path between a first input terminal and a first output terminal, a second signal path between a second input terminal and a second output terminal, the first signal path comprising a first single-ended transconductor means and the second signal path comprising a second single-ended transconductor means, and a cancellation network situated along the first and second signal paths prior to the first and second transconductor means, wherein the cancellation network is configured to provide cancellation at input ports of the first and second single-ended transconductor means of a common-mode voltage applied to the first and second input terminals.

2. A balanced transconductor as claimed in claim 1, wherein the first and second single-ended transconductor means each have a transconductance $-G$ and the cancellation network comprises a first resistor means having resistance R coupled between the first input terminal and the input port of the first single-ended transconductor means and a second resistor means having a resistance R coupled between the second input terminal and the input port of the second single-ended transconductor means and third, fourth, fifth and sixth single-ended transconductor means each having a transconductance $-G'/2$ where $G'=1/R$, wherein an input of the third transconductor means is coupled to the first input terminal, an input of the fourth transconductor means is coupled to the first input terminal, an input of the fifth transconductor means is coupled to the second input terminal, an input of the sixth transconductor means is coupled to the second input terminal, an output of the third transconductor means is coupled to the input port of the second transconductor means, an output of the fourth transconductor means is coupled to the input port of the first transconductor means, an output of the fifth transconductor means is coupled to the input port of the first transconductor means and an output of the sixth transconductor means is coupled to the input port of the second transconductor means.

3. An electronic device comprising a balanced transconductor as claimed in claim 1.

4. A balanced transconductor comprising a first signal path between a first input terminal and a first output terminal, a second signal path between a second input terminal and a second output terminal, the first signal path comprising a first single-ended transconductor means and the second signal path comprising a second single-ended transconductor means, and a cancellation network coupled to the first and second signal paths, wherein the cancellation network is configured to provide cancellation at input ports of the first and second single-ended transconductor means of a common-mode voltage applied to the first and second input terminals, and the cancellation network comprises third, fourth, fifth and sixth single-ended transconductor means, wherein an input of the third transconductor means is coupled to the first input terminal, an input of the fourth transconductor means is coupled to the first input terminal, an input of the fifth transconductor means is coupled to the second input terminal, an input of the sixth transconductor means is coupled to the second input terminal, an output of the third transconductor means is coupled to the input port of the second transconductor means, an output of the fourth transconductor means is coupled to the input port of the first transconductor means, an output of the fifth transconductor means is coupled to the input port of the first transconductor means and an output of the sixth transconductor means is coupled to the input port of the second transconductor means.

* * * * *